United States Patent
Nagatomo

(10) Patent No.: US 9,318,873 B2
(45) Date of Patent: Apr. 19, 2016

(54) SURFACE EMITTING LASER AND OPTICAL COHERENCE TOMOGRAPHY APPARATUS INCLUDING THE SAME

(71) Applicant: CANON KABUSHIKI KAISHA, Tokyo (JP)

(72) Inventor: Yasuhiro Nagatomo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/755,504

(22) Filed: Jun. 30, 2015

(65) Prior Publication Data
US 2015/0380904 A1  Dec. 31, 2015

(30) Foreign Application Priority Data
Jun. 30, 2014 (JP) ................. 2014-135390

(51) Int. Cl.
*H01S 5/183* (2006.01)
*H01S 5/18* (2006.01)
*G01B 9/02* (2006.01)
*H01S 5/187* (2006.01)

(52) U.S. Cl.
CPC ........ *H01S 5/18361* (2013.01); *G01B 9/02091* (2013.01); *H01S 5/18* (2013.01); *H01S 5/183* (2013.01); *H01S 5/18316* (2013.01); *H01S 5/18363* (2013.01); *H01S 5/18366* (2013.01); *G01B 9/02004* (2013.01); *H01S 5/187* (2013.01); *H01S 5/1838* (2013.01); *H01S 5/18308* (2013.01); *H01S 5/18322* (2013.01); *H01S 5/18341* (2013.01); *H01S 5/18358* (2013.01); *H01S 5/18369* (2013.01); *H01S 2301/163* (2013.01)

(58) Field of Classification Search
CPC ........... H01S 5/18; H01S 5/183; H01S 5/187; H01S 5/18316; H01S 5/18322; H01S 5/18361; H01S 5/18363; H01S 5/18366; G01B 9/02004; G01B 9/02091
See application file for complete search history.

(56) References Cited

U.S. PATENT DOCUMENTS 6,549,687 B1  4/2003  Kochergin et al.

FOREIGN PATENT DOCUMENTS

JP   2005-222968 A   8/2005

OTHER PUBLICATIONS

Fred Sugihwo, XP055142453, "Design and Fabrication of Wavelength Tunable Optoelectronic Devices", cover page, p. 74, paragraph 4.2 through p. 104 and FIGS. 4.7, 4.11, 5.1 and 5.8-5.9, Aug. 1998.
Extended European Search Report for European Patent App. No. 15001888.5, dated Jan. 15, 2016, pp. 1-10.

*Primary Examiner* — Armando Rodriguez
(74) *Attorney, Agent, or Firm* — Canon USA, Inc. IP Division

(57) ABSTRACT

A surface emitting laser includes a lower reflector, an active layer, and an upper reflector that are arranged in that order; an air gap provided between the active layer and the upper reflector; and a slab provided on an optical path of the air gap and having a refractive index that is higher than a refractive index of the air gap. A position of at least one of the upper reflector and the lower reflector in an optical axis direction is changed to change a wavelength of emitted light. In the case where the position of the upper reflector is changed, a center of the slab in the optical axis direction is located between any antinode of a standing wave formed in the air gap and a node of the standing wave that is adjacent to and on an upper-reflector side of the antinode.

11 Claims, 12 Drawing Sheets

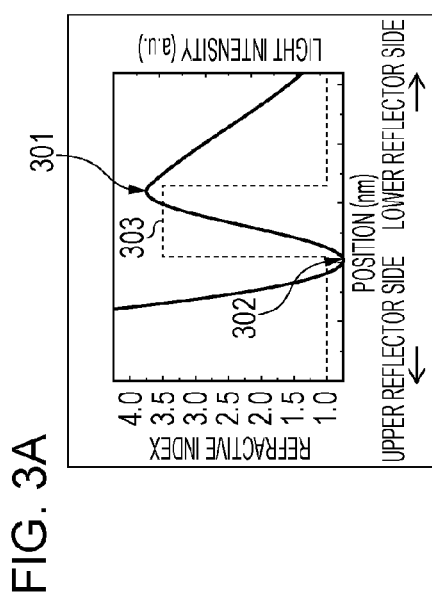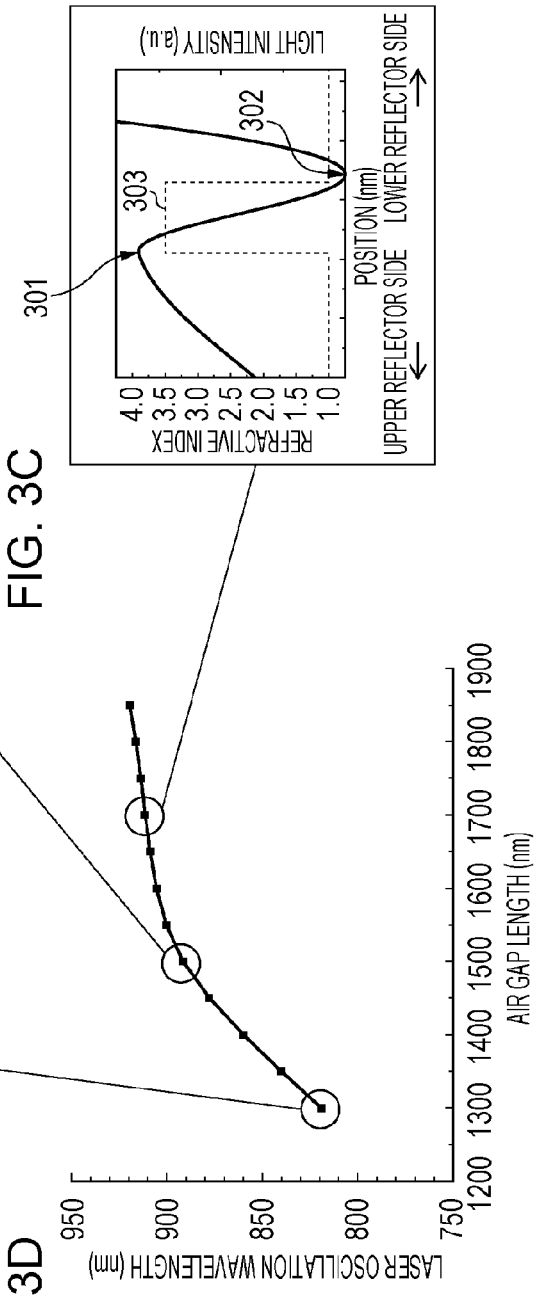

SURFACE EMITTING LASER AND OPTICAL COHERENCE TOMOGRAPHY APPARATUS INCLUDING THE SAME

BACKGROUND OF THE INVENTION

1. Field of the Invention

The present invention relates to a wavelength tunable surface emitting laser and an optical coherence tomography apparatus including the surface emitting laser.

2. Description of the Related Art

Wavelength tunable lasers, which are capable of changing a laser oscillation wavelength thereof, are expected to be applicable to various fields, such as communications, sensing, imaging, etc., and therefore have been widely researched and developed in recent years.

A wavelength tunable vertical-cavity surface emitting laser (VCSEL) structure is an example of a wavelength tunable laser. The wavelength tunable VCSEL structure controls a laser oscillation wavelength of a vertical-cavity surface emitting laser (VCSEL) by using micro electro mechanical system (MEMS) technologies.

VCSELs generally include an active layer that is sandwiched between a pair of reflectors, such as distributed Bragg reflectors (DBRs), and a laser beam is oscillated at a wavelength corresponding to a cavity length determined by an optical distance between the reflectors. In wavelength tunable VCSELs according to the related art, the cavity length is changed by moving one of the reflectors while an air gap is provided between one of the reflectors and another layer (generally a semiconductor layer), so that the laser oscillation wavelength is changed accordingly (see U.S. Pat. No. 6,549,687).

An amount of change in a laser oscillation wavelength of a wavelength tunable VCSEL relative to an amount of movement of a reflector is sometimes referred to as a wavelength tuning efficiency. As the wavelength tuning efficiency increases, an amount of movement of the reflector required to cause a certain wavelength change decreases. Accordingly, a voltage required to mechanically drive the reflector decreases. To increase a wavelength tuning speed, the resonance frequency of the reflector may be increased. In such a structure, the spring constant is generally increased, and the amount of movement of the reflector is reduced. When the wavelength tuning efficiency is high, since the amount of movement of the reflector required to cause a certain wavelength change is small, the wavelength tunable range and the wavelength tuning speed can be increased at the same time.

SUMMARY OF THE INVENTION

The inventor of the present invention has found that there is a limit to how much the wavelength tuning efficiency can be increased in a wavelength tunable VCSEL according to the related art. More specifically, in the case where the length of the air gap is fixed, the wavelength tuning efficiency increases as part of the cavity length excluding the length of the air gap (sometimes referred to as semiconductor cavity length) decreases. However, in a VCSEL in which electrodes are provided on top and bottom end surfaces of a semiconductor layer and in which an active layer emits light when a current is injected thereinto by the electrodes, layers thick enough for current diffusion and confinement cannot be provided if the semiconductor cavity length is small. Therefore, there is a risk that a current will unnecessarily flow to a region other than a light emitting region or a current will be injected only into a portion of the active layer by the electrodes. As a result, the light emission efficiency decreases relative to the amount of current injected. In other words, when the semiconductor cavity length is small, the light emission efficiency may be reduced. Thus, the inventors of the present invention have found that it is desirable to provide a method for increasing the wavelength tuning efficiency without reducing the semiconductor cavity length.

In light of the above-described circumstances, the present invention provides a surface emitting laser with which the wavelength tuning efficiency can be increased without reducing the semiconductor cavity length.

A surface emitting laser according to an aspect of the present invention includes a lower reflector, an active layer, and an upper reflector that are arranged in that order; an air gap provided between the active layer and the upper reflector; and a slab provided on an optical path of the air gap and having a refractive index that differs from a refractive index of the air gap. A position of at least one of the upper reflector and the lower reflector in an optical axis direction is changed to change a wavelength of emitted light. In the case where the position of the upper reflector is changed, a center of the slab in the optical axis direction is located between any antinode of a standing wave formed in the air gap and a node of the standing wave on an upper-reflector side of the antinode. In the case where the position of the lower reflector is changed, the center of the slab in the optical axis direction is located between any antinode of the standing wave formed in the air gap and a node of the standing wave on a lower-reflector side of the antinode.

Further features of the present invention will become apparent from the following description of exemplary embodiments with reference to the attached drawings.

BRIEF DESCRIPTION OF THE DRAWINGS

FIGS. 3A to 3D are graphs showing calculation results for describing the influence of the positional relationship between a slab and a light intensity distribution in the surface emitting laser according to the embodiment of the present invention.

DESCRIPTION OF THE EMBODIMENTS

Embodiment

A wavelength tunable vertical-cavity surface emitting laser (VCSEL) according to an embodiment of the present invention will be described.

First, definitions of terms used in this specification will be described.

In this specification, a substrate side of a laser element is defined as a lower side, and a side opposite to the substrate side is defined as an upper side.

In this specification, a center wavelength is the wavelength at the center of a wavelength range of a laser beam that can be emitted from the surface emitting laser. In other words, the center wavelength is the average between the minimum and maximum wavelengths at which the laser beam can be oscillated. The wavelength at which the laser beam can be oscillated depends on, for example, a variable range of the cavity length, a reflection range of the reflector, and a gain range of an active layer. In the design phase, basically, the center wavelength is set and then the structures of components are determined accordingly. In this specification, the "center" of a slab or an active layer means the middle point along the thickness in an optical axis direction. The optical axis direction is the direction of a line that connects an upper reflector and a lower reflector, which will be described below, and is perpendicular to a principal surface of the substrate.

In this specification, a means a single wavelength. Here, the wavelength is the center wavelength of the surface emitting laser unless otherwise specified.

In this specification, calculation results are obtained by calculating the electromagnetic field distribution in a microcavity by the transfer matrix method in consideration of the boundary conditions of the Maxwell's equations.

DESCRIPTION OF PROBLEMS OF RELATED ART

Figure 9:
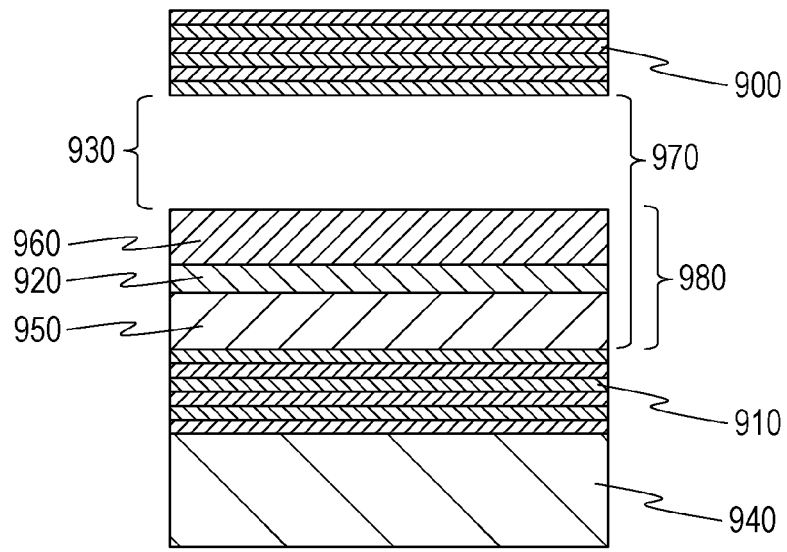
FIG. 9 is a schematic sectional view illustrating the structure of a wavelength tunable VCSEL according to the related art.

First, problems of a wavelength tunable VCSEL according to the related art will be described in detail. FIG. 9 is a schematic sectional view of the wavelength tunable VCSEL according to the related art.

Figure 10:
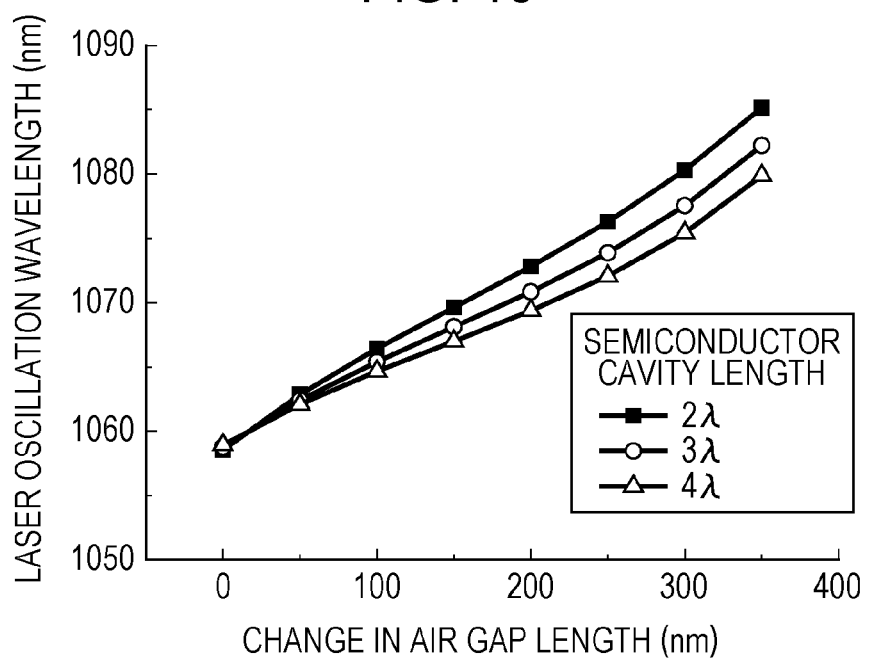
FIG. 10 is a graph showing the optical characteristics of the wavelength tunable VCSEL according to the related art.

The wavelength tunable VCSEL illustrated in FIG. 9 is formed of a compound semiconductor including GaAs as a base material, and is designed such that the center wavelength is 1060 nm and that the wavelength is tunable around the center wavelength. A microcavity structure, in which an active layer 920 and an air gap 930 are disposed between an upper reflector 900 and a lower reflector 910, is provided on a substrate 940. Each of the upper and lower reflectors 900 and 910 is a distributed Bragg reflector (DBR) formed of a multilayer film. The active layer 920 is sandwiched between a lower cladding layer 950 and an upper cladding layer 960. The optical distance between the upper reflector 900 and the lower reflector 910 is referred to as a cavity length 970, and an optical distance between the interface between the upper cladding layer and the air gap and the interface between the lower reflector 910 and the lower cladding layer 950 is referred to as a semiconductor cavity length 980. The cavity length can be changed by moving the upper reflector 900 in an optical axis direction so as to change the length of the air gap 930. Accordingly, the laser oscillation wavelength is changed. Here, the optical axis direction is the direction of a line that connects the upper reflector and the lower reflector, and is perpendicular to the principal surface of the substrate. In FIG. 9, the optical axis direction corresponds to the vertical direction. FIG. 10 shows calculation results of the relationship between the length of the air gap (air gap length) of the wavelength tunable VCSEL structure illustrated in FIG. 9 and the laser oscillation wavelength. Calculations were performed for three types of structures having different semiconductor cavity lengths 980.

It is clear from the calculation results that the slope of the graph increases as the semiconductor cavity length 980 decreases. The slope of the graph ($\partial\lambda/\partial d_{air}$) shows the amount of change in the laser oscillation wavelength ($\lambda$) relative to the amount of change in the air gap length ($d_{air}$), and is referred to as a wavelength tuning efficiency. Therefore, it can be said that as the semiconductor cavity length decreases, the wavelength tuning efficiency increases.

An increase in the wavelength tuning efficiency leads to an increase in the longitudinal mode spacing. When the longitudinal mode spacing is small, the laser oscillation wavelength may be changed intermittently due to mode hopping, or oscillation may occur at multiple wavelengths at the same time. Accordingly, the wavelength tunable range is limited in a single mode. This limitation can be reduced by increasing the longitudinal mode spacing.

The influence of the wavelength tuning efficiency on the longitudinal mode spacing will be described with reference to calculation results shown in FIGS. 11A and 11B.

Figure 11A:
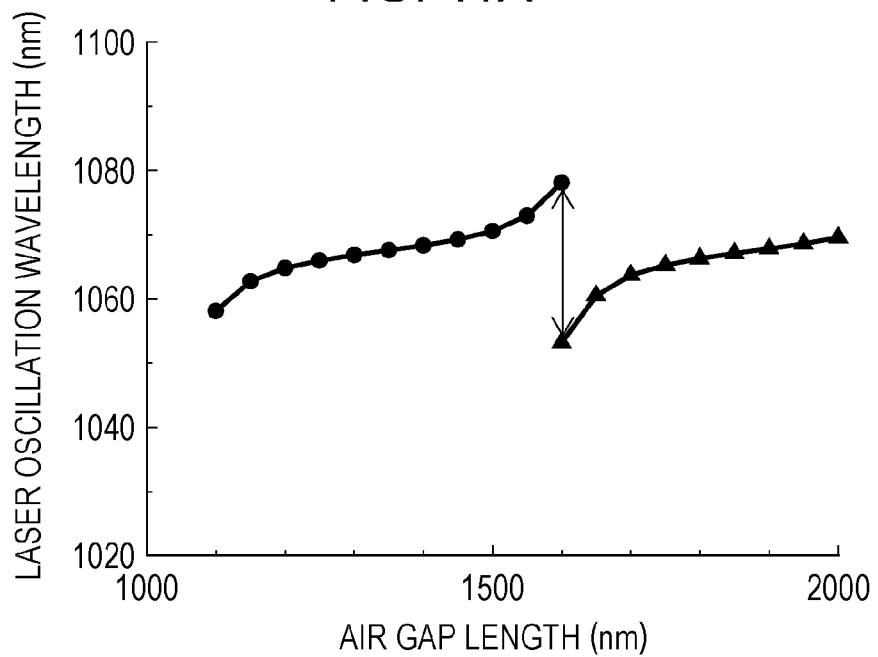
FIGS. 11A and 11B are graphs showing the relationship between the wavelength tuning efficiency and the longitudinal mode spacing.
Figure 11B:
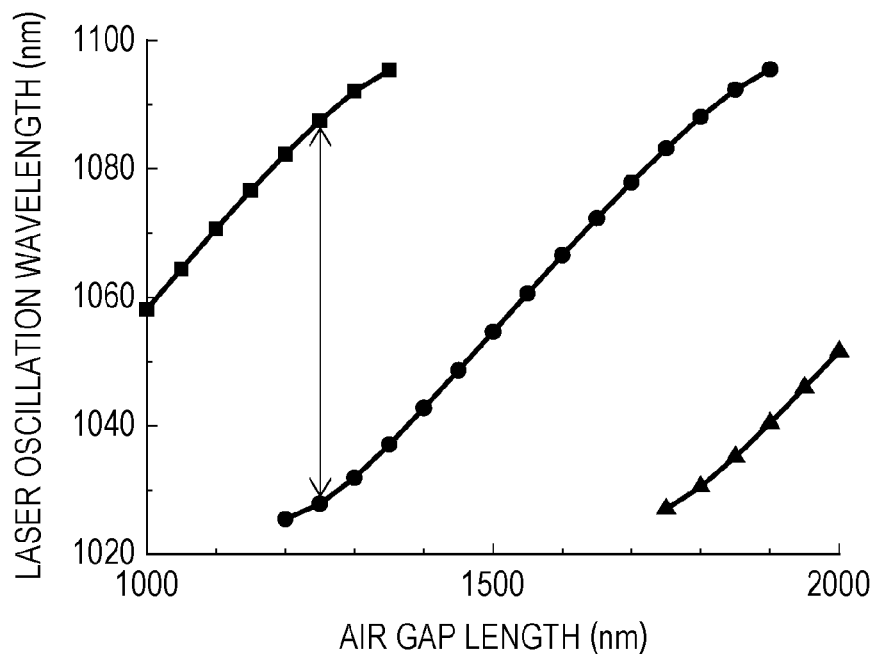

FIGS. 11A and 11B are graphs showing calculation results for microcavity structures in which the wavelength tuning efficiency (around the center wavelength) is about 0.015 and about 0.12, respectively. Both wavelength tunable VCSELs are designed so that the wavelength thereof is tunable around a center wavelength of 1065 nm, but have different wavelength tuning efficiencies due to differences in the microcavity structure.

In FIG. 11A, a wavelength gap between longitudinal modes of adjacent orders is about 25 nm. In FIG. 11B, a wavelength gap between longitudinal modes of adjacent orders is about 60 nm.

Thus, the longitudinal mode spacing increases as the wavelength tuning efficiency increases.

The above-described problem will be described in more detail.

As described above with reference to the calculation results shown in FIG. 10, it is known that the wavelength tuning efficiency depends on the semiconductor cavity length. Although the wavelength tuning efficiency can be effectively increased by reducing the semiconductor cavity length, in practice, there is a limit to how much the wavelength tuning efficiency can be increased.

In particular, in the structure in which a laser beam is oscillated by injecting a current, layers for current diffusion and confinement need to be provided. Therefore, the semiconductor cavity length needs to be larger than that in the structure in which a laser beam is oscillated by photoexcitation. Thus, it is difficult to increase the wavelength tuning efficiency.

Accordingly, there has been a demand for a method for increasing the wavelength tuning efficiency without reducing the semiconductor cavity length. In a surface emitting laser according to the present embodiment, the wavelength tuning efficiency can be increased by arranging a member (slab) for amplifying an effective cavity length variation at an appropriate position in an air gap of a microcavity. The effective cavity length is a cavity length obtained by multiplying the actual length by a refractive index and taking the light intensity into account.

Here, the appropriate position is a position where the center of the slab in the optical axis direction is located between any antinode of a standing wave that is formed in the air gap and has the center wavelength and a node of the standing wave that is adjacent to and on the upper-reflector side of the antinode.

Figure 1:
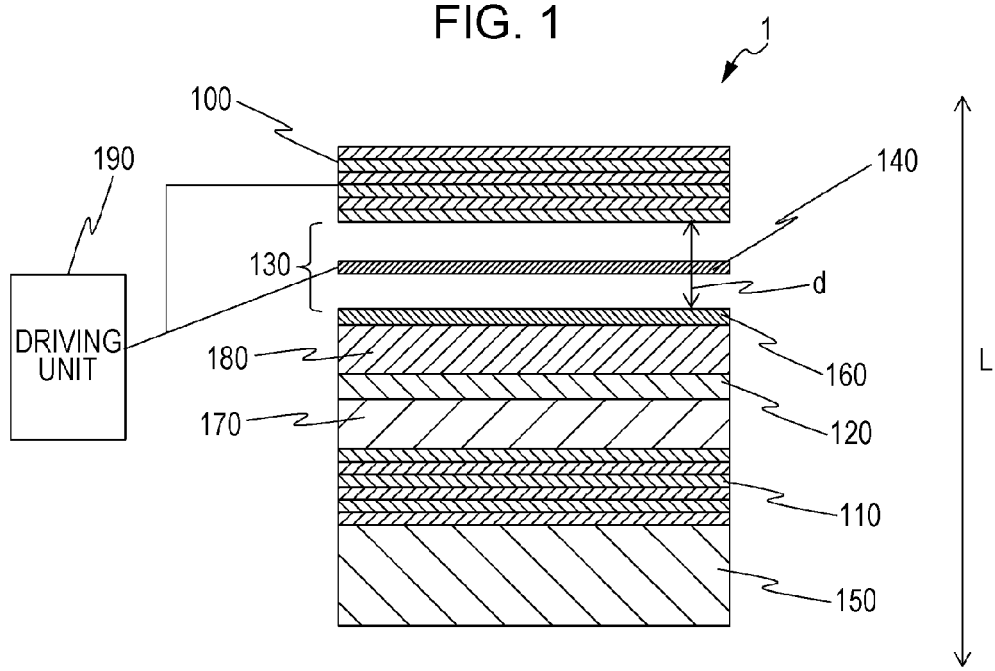
FIG. 1 is a schematic sectional view illustrating the structure of a surface emitting laser according to an embodiment of the present invention.

In other words, the appropriate position is a position where, in the standing wave formed in the air gap and having the center wavelength, the light intensity at the center of the slab in the optical axis direction is higher when the length of the air gap in the optical axis direction is A than when the length of the air gap in the optical axis direction is B, which is smaller than A. Namely, the appropriate position is a position where, in the wavelength tunable VCSEL that emits a laser beam oscillated at a wavelength around the center wavelength, the light intensity distribution of the slab increases as the air gap length increases and decreases as the air gap length decreases. In FIG. 1, the length of the air gap in the optical axis direction is denoted by d.

The positions of antinodes and nodes of a standing wave are determined by the laser oscillation wavelength, the optical distance from the lower reflector, and a phase change caused at the time of reflection by the lower reflector. Therefore, the position of the slab can be determined accordingly.

The amplification of the effective cavity length variation is an effect of changing the effective optical thickness by an amount greater than the actual amount of change in the cavity length when the cavity length is changed in accordance with a change in the air gap length caused by a movement of the upper reflector.

In order for the slab to have the above-described effect, the slab needs to have a refractive index higher than the refractive index of the background, that is, the air gap.

The air gap may either be filled with a gas or a liquid, or be evacuated. Here, evacuation means to reduce the air pressure to a negative pressure that is lower than the standard atmospheric pressure.

In this specification, calculations are performed on the assumption that the air gap is filled with air and the refractive index is 1.

Surface Emitting Laser

A surface emitting laser according to an embodiment of the present invention will be described with reference to FIG. 1.

A surface emitting laser 1 according to the present embodiment includes a substrate 150, a lower reflector 110, a lower cladding layer 170, an active layer 120, an upper cladding layer 180, an antireflection film 160, and an upper reflector 100, which are arranged in that order. An air gap 130 is provided between the active layer 120 and the upper reflector 100.

A slab 140, which has a refractive index that differs from that of the air gap 130, is disposed on an optical path of the air gap 130. In the present embodiment, each of the upper reflector 100 and the lower reflector 110 is a distributed Bragg reflector (DBR) formed of a multilayer film. A region between the upper reflector 100 and the lower reflector 110 serves as a microcavity, in which a standing wave is formed. The upper reflector 100 is movable in an optical axis direction (direction shown by the double-pointed arrow L in FIG. 1). The cavity length can be changed by changing the length d of the air gap 130 between the upper reflector 100 and the antireflection film 160 (sometimes referred to as an air gap length), and the resonance wavelength is changed accordingly. The length d of the air gap is the distance between a semiconductor multilayer body, which includes the active layer 120 and the lower reflector 110, and the upper reflector 100 along an optical axis. For example, in FIG. 1, when the antireflection film 160 is not provided, the length d is the distance between the upper reflector 100 and the upper cladding layer 180. When both the antireflection film and the upper cladding layer are not provided, the length d is the distance between the upper reflector 100 and the active layer 120.

Thus, in the surface emitting laser 1 according to the present embodiment, the position of the upper reflector 100 is changed in the optical axis direction by using a driving unit 190 for moving the upper reflector 100, so that the air gap length is changed and the wavelength of the emitted light is changed accordingly.

In the surface emitting laser according to the present embodiment, the wavelength tuning efficiency can be increased by arranging the slab 140 at an appropriate position in the optical axis direction (direction shown by L in FIG. 1).

The appropriate position is a position where the center of the slab 140 in the optical axis direction is located between any antinode of a standing wave that is formed in the air gap 130 and has the center wavelength and a node of the standing wave that is adjacent to and on the upper-reflector-100 side of the antinode. In the case where the position of the lower reflector 110 is changed, the center of the slab 140 in the optical axis direction is located between any antinode of the standing wave that is formed in the air gap 130 and a node of the standing wave on the lower-reflector-110 side of the antinode.

Figure 2:
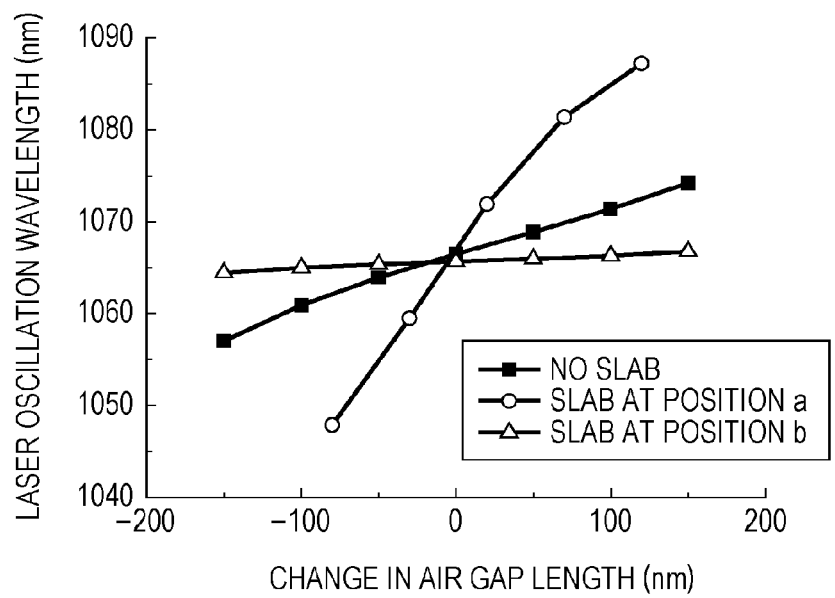
FIG. 2 is a graph showing a calculation result of optical characteristics of the surface emitting laser according to the embodiment of the present invention.

FIG. 2 is a graph showing examples of calculation results for describing the effect of the surface emitting laser according to the present embodiment.

The graph shows calculation results for a wavelength tunable VCSEL structure according to the related art in which no slab is arranged in the air gap, a structure of the surface emitting laser according to the present embodiment in which the slab is arranged at an appropriate position a in the air gap, and a comparative structure in which the slab is arranged at an inappropriate position b in the air gap. All of these structures are wavelength tunable VCSEL structures designed so that the wavelength is tunable around a center wavelength of 1065 nm.

The wavelength tuning efficiency of the structure in which no slab is arranged is about 0.05 in a range around the center wavelength.

The wavelength tuning efficiency of the structure in which the slab is arranged at the appropriate position a in the air gap is about 0.24 in a range around the center wavelength.

The wavelength tuning efficiency of the structure in which the slab is arranged at the inappropriate position b in the air gap is about 0.006 in a range around the center wavelength.

Thus, the wavelength tuning efficiency can be increased by arranging the slab at an appropriate position in the air gap.

The appropriate position of the slab in the structure to which the present invention is applied will now be described.

FIGS. 3A to 3D are graphs showing calculation results for describing the influence of the positional relationship between the slab and the standing wave (light intensity distribution) on the wavelength tuning efficiency.

The calculations are performed for a wavelength tunable VCSEL to which the present invention is applied and which is designed such that the wavelength is tunable in a wavelength range around 800 to 900 nm.

FIG. 3D is a graph showing a calculation result of the relationship between the laser oscillation wavelength and the air gap length. In FIG. 3D, the slope of the graph, that is, the wavelength tuning efficiency, is changed at an intermediate position, and the graph has a bent shape.

FIGS. 3A to 3C are graphs showing calculation results of the refractive index distribution and the light intensity distribution in a region around the slab at three representative points, which are a point at which the wavelength tuning efficiency is high (point A), a point at which the graph is bent (point B), and a point at which the wavelength tuning efficiency is low (point C). The dashed lines show the refractive index distribution, and the solid lines show the light intensity distribution. The region in which the refractive index is high corresponds to the slab arranged in the air gap.

For convenience, the left-right direction in FIGS. 3A to 3C corresponds to the vertical direction of the actual wavelength tunable VCSEL structure.

At point A, the center 303 of the slab is located between an antinode 301 of the standing wave and a node 302 of the standing wave that is adjacent to and on the upper-reflector side of the antinode 301. In other words, in this case, the slab is at the appropriate position a in the air gap.

At point B, the center 303 of the slab is located near an antinode 301 of the standing wave.

At point C, the center 303 of the slab is located between an antinode 301 of the standing wave and a node 302 of the standing wave that is adjacent to and on the lower-reflector side of the antinode 301. In other words, in this case, the slab is at the inappropriate position b in the air gap.

As described above, in the structure for which the calculations are performed, the reflector that is located above the slab in the air gap (upper reflector) is movable in the optical axis direction.

In other words, the state in which the slab is disposed between an antinode of the standing wave and a node of the standing wave that is adjacent to and on the upper-reflector side of the antinode corresponds to point A.

Principle of Improvement of Wavelength Tuning Efficiency

The reason why the wavelength tuning efficiency is increased when the slab is arranged at the above-described position will be qualitatively described.

In the wavelength tunable VCSEL to which the present invention is applied, there are two factors that cause a change in the laser oscillation wavelength in accordance with a change in the air gap length.

The first factor is the influence caused by a change in the visual length of the microcavity.

When the air gap length is increased, the visual cavity length is also increased. The optical thickness of the microcavity is expressed as the product of the visual cavity length and the refractive index. Therefore, the optical cavity length basically increases when the visual cavity length increases, and the laser oscillation wavelength increases accordingly. This is a well-known principle based on which the laser oscillation wavelength is changed in a wavelength tunable VCSEL according to the related art.

The second factor is the influence caused by a change in the effective refractive index.

In the case where the refractive index of the slab arranged in the air gap differs from the refractive index of the background, that is, the air gap, the effective refractive index for light is changed when the proportion of the light that is present in the slab is changed.

For example, in the case where the refractive index of the slab is greater than the refractive index of the background, that is, the air gap, the effective refractive index for light increases as the proportion of the light that is present in the slab increases.

As a result, the effective optical thickness increases, and the laser oscillation wavelength increases accordingly.

The wavelength tuning efficiency is increased when the above-described two influences enhance each other, and is reduced when the above-described two influences weaken each other. The surface emitting laser according to the present embodiment is structured such that the two influences enhance each other.

In other words, the surface emitting laser is structured such that the light intensity distribution in the slab is increased when the air gap length is increased, and is reduced when the air gap length is reduced.

More specifically, the surface emitting laser is structured such that the center of the slab is located between any antinode of a standing wave that is formed in the microcavity and has the center wavelength and a node of the standing wave that is adjacent to and on the upper-reflector side of the antinode.

The principle of improvement of the wavelength tuning efficiency due to the structure of the surface emitting laser according to the present embodiment will now be described with reference to FIGS. 4A to 4F.

FIGS. 4A to 4F are graphs showing calculation results of the refractive index and the standing wave (light intensity distribution) in a region around the slab that is arranged in the air gap in a wavelength tunable VCSEL structure designed such that the wavelength is tunable around a center wavelength of 1065 nm. The dashed lines show the refractive index distribution, and the solid lines show the light intensity distribution. The region in which the refractive index is high corresponds to the slab arranged in the air gap.

Figure 4A:
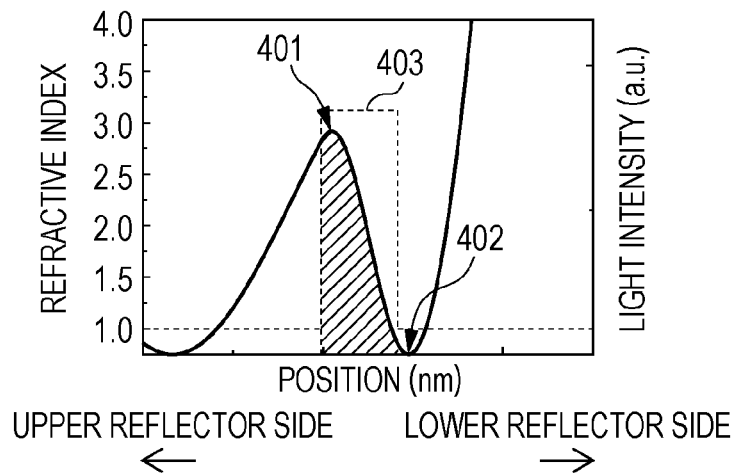
FIGS. 4A to 4F are graphs showing calculation results of light intensity distributions around the slab in the surface emitting laser according to the embodiment of the present invention.
Figure 4B:
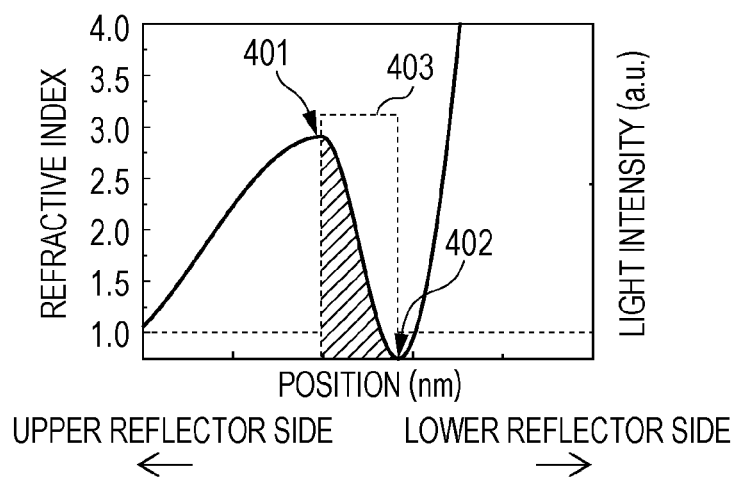
Figure 4C:
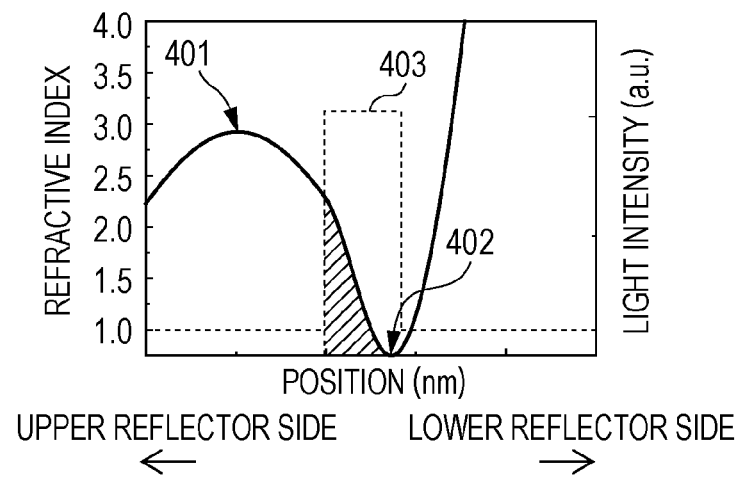

FIGS. 4A to 4C show calculation results for a comparative structure in which the slab is arranged at an inappropriate position unlike the structure of the surface emitting laser according to the present embodiment. In each of FIGS. 4A to 4C, the center of a slab 403 along the optical axis is located between an antinode 401 of the light intensity distribution and a node 402 of the light intensity distribution that is adjacent to and on the lower-reflector side of the antinode 401.

FIG. 4B shows a calculation result for a case in which the air gap length is such that a laser beam is oscillated at a wavelength close to the center wavelength.

FIG. 4A shows a calculation result for a case in which the air gap length is 100 nm smaller than that in FIG. 4B.

FIG. 4C shows a calculation result for a case in which the air gap length is 100 nm larger than that in FIG. 4B.

Figure 4D:
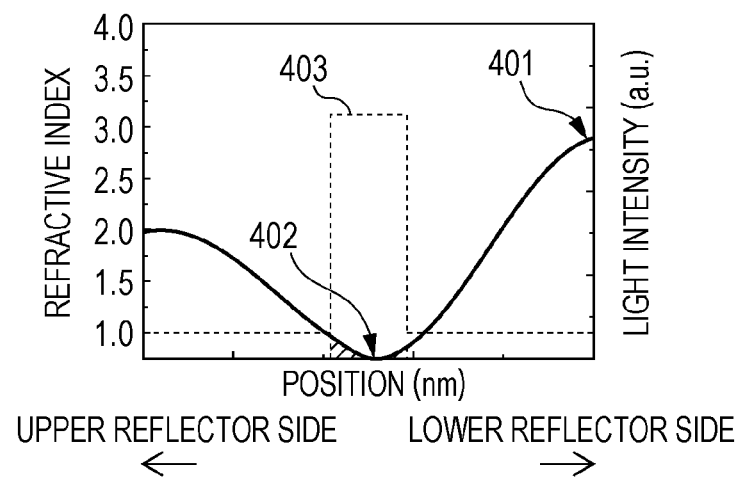
Figure 4E:
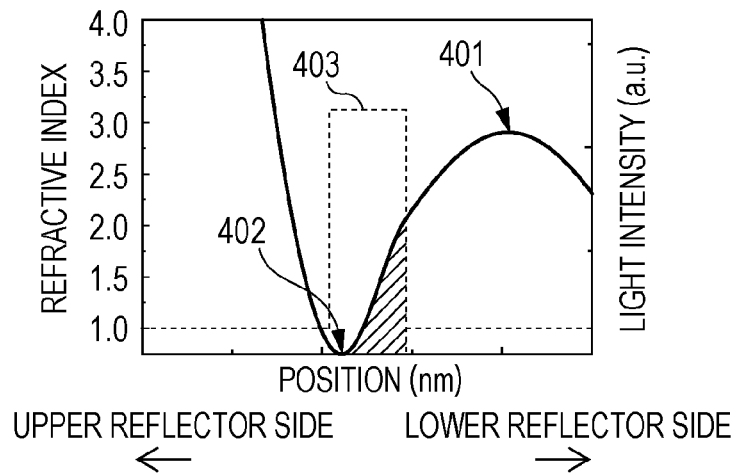
Figure 4F:
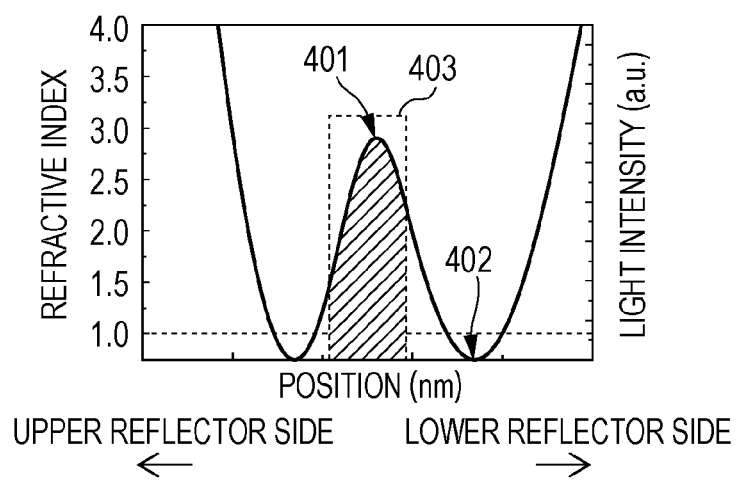

FIGS. 4D to 4F show calculation results for a structure in which the slab is arranged at an appropriate position, that is, the structure of the surface emitting laser according to the present embodiment. In each of FIGS. 4D to 4F, the center of the slab 403 along the optical axis is located between an antinode 401 of the light intensity distribution and a node 402 of the light intensity distribution that is adjacent to and on the upper-reflector side of the antinode 401.

FIG. 4E shows a calculation result for a case in which the air gap length is such that a laser beam is oscillated at a wavelength close to the center wavelength.

FIG. 4D shows a calculation result for a case in which the air gap length is 100 nm smaller than that in FIG. 4E.

FIG. 4F shows a calculation result for a case in which the air gap length is 100 nm larger than that in FIG. 4E.

In each graph, the region in which the light intensity distribution overlaps the slab is shown by hatching. The area of this region corresponds to the proportion of the light that is present in the slab.

For convenience, the left-right direction in FIGS. 4A to 4F corresponds to the vertical direction of the actual wavelength tunable VCSEL structure.

In the calculation results shown in FIG. 4A to C, the amount of light present in the slab decreases as the air gap length increases. This corresponds to the above-described case in which the two influences on the laser oscillation wavelength weaken each other. Therefore, the wavelength tuning efficiency is reduced.

In the calculation results shown in FIGS. 4D to 4F, the amount of light present in the slab increases as the air gap length increases. This corresponds to the above-described case in which the two influences on the laser oscillation wavelength enhance each other. Therefore, the wavelength tuning efficiency is increased.

As a result, the difference in wavelength tuning efficiency described above with reference to FIGS. 2 and 3A to 3D occurs.

The positions of antinodes and nodes of a standing wave are determined by the laser oscillation wavelength $\lambda$, the optical distance from the lower reflector, and a phase change caused at the time of reflection by the lower reflector. Therefore, the position of the slab can be determined accordingly.

In the case of free end reflection in which the phase change caused at the time of reflection by the lower reflector is 0, antinodes are provided at positions where the distance from the upper end of the lower reflector is $\lambda/2 \times m$, and nodes are provided at positions where the distance from the upper end of the lower reflector is $\lambda/2 \times m + \lambda/4$ (here and below, m is a natural number).

In the case of fixed end reflection in which the phase change caused at the time of reflection is $\pi$, antinodes are provided at positions where the distance from the upper end of the lower reflector is $\lambda/2 \times m + \lambda/4$, and nodes are provided at positions where the distance from the upper end of the lower reflector is $\lambda/2 \times m$.

Assuming that the center wavelength is $\lambda_c$, when the distance L from the upper end of the lower reflector to the center of the slab in the optical axis direction satisfies $\lambda_c/2 \times m < L < \lambda_c/2 \times m + \lambda_c/4$ (in the case of free end reflection) or $\lambda_c/2 \times (m-1) + \lambda_c/4 < L < \lambda_c/2 \times m$ (in the case of fixed end reflection), the wavelength tuning efficiency is increased in a range around the center wavelength $\lambda_c$.

When the phase change caused at the time of reflection by the lower reflector is neither 0 nor $\pi$, the slab may be arranged at an intermediate position between the positions for the above-described two cases depending on the amount of phase change.

In this specification, it is assumed that light reflections at the interfaces of the upper and lower reflectors are free end reflections unless otherwise specified.

Figure 5:
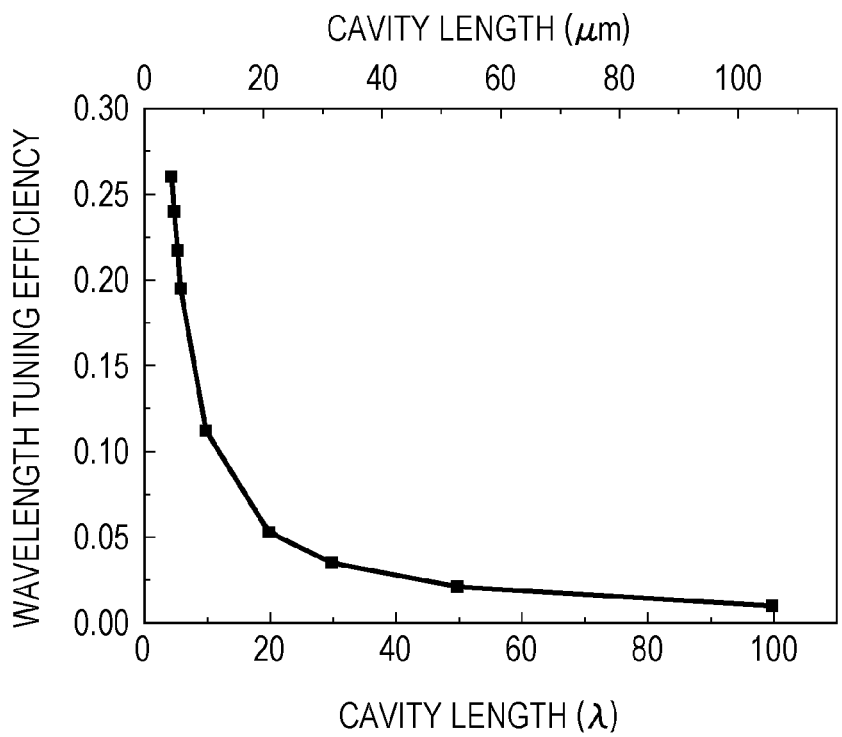
FIG. 5 is a graph showing a calculation result for describing the influence of a cavity length in the surface emitting laser according to the embodiment of the present invention.

As described above with reference to FIG. 10, in the VCSEL structure, the wavelength tuning efficiency decreases as the semiconductor cavity length increases. Here, the semiconductor cavity length is the length of a portion of the microcavity, which is formed between the upper reflector and the lower reflector, excluding the air gap in the optical axis direction. FIG. 5 is a graph showing a calculation result of the relationship between the cavity length (length of the optical path including the semiconductor microcavity and the air gap) and the wavelength tuning efficiency.

The graph has two horizontal axes at the top and bottom. One of the horizontal axes represents the actual cavity length, and the other represents the cavity length normalized by the center wavelength $\lambda_c$.

Referring to FIG. 5, the wavelength tuning efficiency suddenly increases when the semiconductor cavity length becomes smaller than or equal to 20 times the center wavelength of the surface emitting laser according to the present embodiment ($20\lambda$ or less), and further increases when the semiconductor cavity length becomes smaller than or equal to 10 times the center wavelength ($10\lambda$ or less). To further increase the wavelength tuning efficiency and maintain the light emission efficiency of the active layer, the semiconductor cavity length may be smaller than or equal to three times the center wavelength.

Slab

In the present embodiment, there is no particular limitation regarding the slab as long as the refractive index of the slab is different from that of the air gap so that the light intensity distribution in the microcavity can be changed. The refractive index of the slab may be greater than that of the air gap. The material of the slab may be selected as appropriate in consideration of the wavelength of the light emitted from the surface emitting laser and a process for forming the slab. More specifically, the material of the slab may be, for example, $Al_xGa_{1-x}As$ ($0<x<1$, preferably $0.6 \le x \le 0.8$), GaAs, Si, or GaN. In the case where a sacrificial layer process is performed to form the slab by using these materials, the combination of the materials of the slab, the sacrificial layer, and the etchant may be as follows. That is, the materials of "the slab; the sacrificial layer; and the etchant" may be "$Al_xGa_{1-x}As$ ($0<x<1$); GaAs; and an aqueous solution of citric acid and a hydrogen peroxide solution", "GaAs; AlGaInP or AlInP or GaInP; and hydrochloric acid", "GaAs; $Al_xGa_{1-x}As$ ($0.9 \le x$); and BHF", "Si; $SiO_2$; and BHF", or "GaN; $(AlInN)O_x$; and NTA:KOH".

The slab is movable by, for example, a MEMS mechanism described below.

The optimum optical thickness of the slab according to the present embodiment will now be described.

Figure 6:
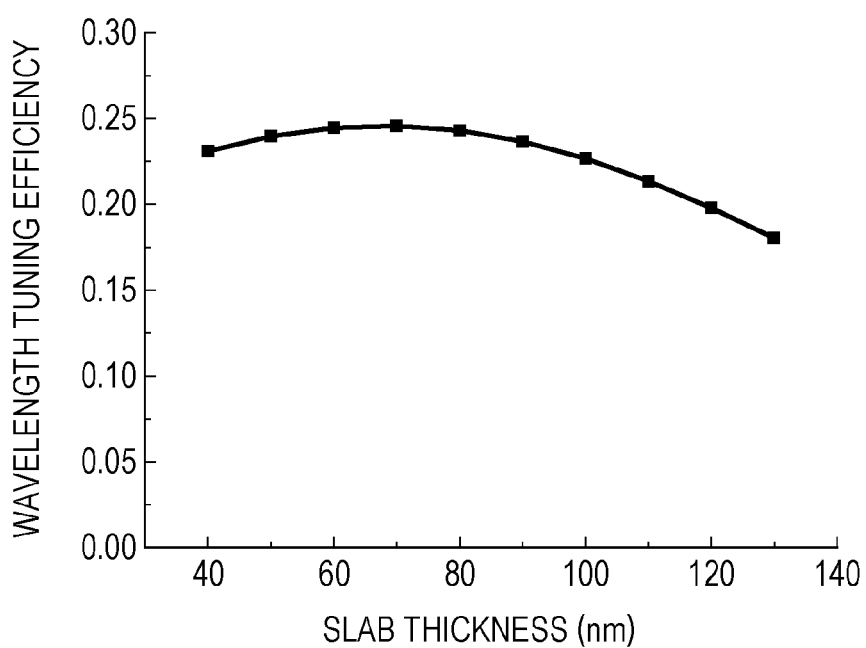
FIG. 6 is a graph showing a calculation result for describing the influence of an optical thickness of the slab in the surface emitting laser according to the embodiment of the present invention.

FIG. 6 is a graph showing an example of a calculation result of the relationship between the optical thickness of the slab and the wavelength tuning efficiency in a range around a center wavelength of 1060 nm according to the present embodiment. In the calculation, it is assumed that the refractive index of the slab is 3.12. It is clear from the graph that the wavelength tuning efficiency is at a maximum when the optical thickness of the slab is around 70 nm, and that the maximum effect cannot be obtained when the slab is too thin or too thick. The optical thickness of the slab at which the wavelength tuning efficiency is at a maximum is about ¼ the center wavelength, and the effect can be increased when the optical thickness is around that value.

The calculation result shows that, to ensure the effectiveness of the slab, the optical thickness of the slab is preferably in the range of more than 0 and less than ½ the center wavelength of the surface emitting laser, and more preferably in the range of more than ⅛ and less than ⅜ the center wavelength.

A similar optical effect can also be obtained when the optical thickness is set to the sum of a value in the above-described ranges and half an integral multiple of the center wavelength.

Also, as is clear from FIG. 6, the thickness of the slab in the present embodiment is preferably in the range of 40 nm or more and 100 nm or less, and more preferably in the range of 60 nm or more and 80 nm or less.

In the surface emitting laser according to the present embodiment, the slab may be disposed at the bottom of the air gap so that no portion of the air gap is disposed below the slab. Also in this case, it is assumed that the slab is disposed in the air gap.

In such a case, the refractive index of a layer that is adjacent to and below the slab is important.

Figure 7:
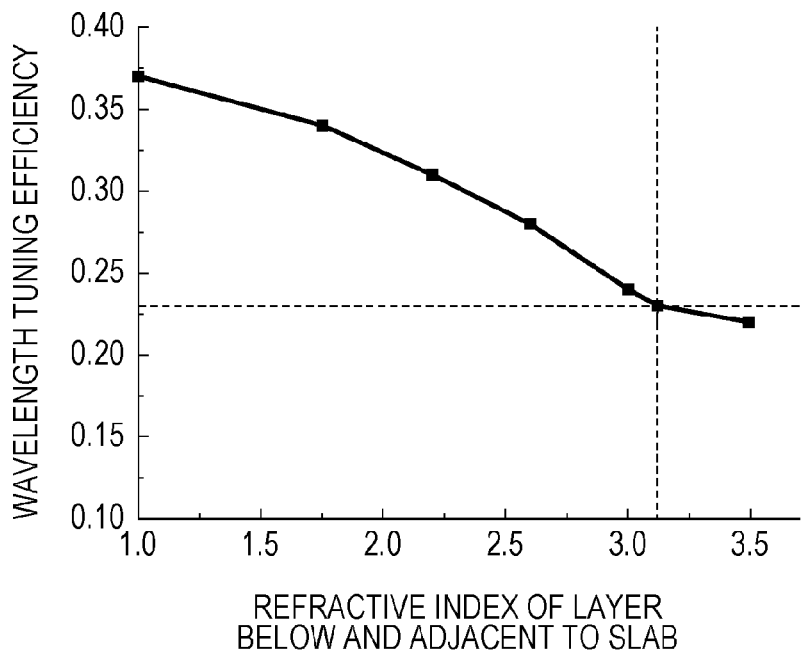
FIG. 7 is a graph showing a calculation result for describing the influence of the refractive index of a layer on the lower side (lower-reflector side) of the slab in the surface emitting laser according to the embodiment of the present invention.

FIG. 7 is a graph showing an example of a calculation result of the relationship between the refractive index of a layer that is adjacent to and below the slab and the wavelength tuning efficiency.

It is assumed that the refractive index of the slab is 3.12, and the refractive index of the slab is indicated by the dashed line in the graph. The region on the left side of the dashed line corresponds to the case in which the refractive index of the layer that is adjacent to and below the slab is lower than that of the slab, and the region on the right side of the dashed line corresponds to the case in which the refractive index of the layer that is adjacent to and below the slab is higher than that of the slab.

The wavelength tuning efficiency of the structure according to the related art in which the slab is not disposed in the air gap is calculated as about 0.23. This value is indicated by the horizontal dashed line in the graph. The range in which the wavelength tuning efficiency is higher than the calculated value matches the range in which the refractive index of the layer below the slab is smaller than that of the slab.

Therefore, in the case where the slab is arranged at the bottom of the air gap, the refractive index of the layer that is adjacent to and below the slab needs to be smaller than the refractive index of the slab.

Active Layer

In the present embodiment, there is no particular limitation regarding the active layer as long as the active layer is made of a material that emits light when a current is injected thereinto, and a material that is used in a common surface emitting laser may be used. The composition, thickness, etc., of the material of the active layer are selected in accordance with the desired laser oscillation wavelength as appropriate.

In the case where light with a wavelength range around 850 nm is to be emitted, a material having a quantum well structure made of $Al_nGa_{(1-n)}As$ ($0 \leq n \leq 1$) may be used as the material of the active layer. In the case where light with a wavelength range around 1060 nm is to be emitted, a material made of $In_nGa_{(1-n)}As$ ($0 \leq n \leq 1$) may be used as the material of the active layer.

According to the present embodiment, the active layer may have a gain over a sufficiently wide range, more specifically, over a wavelength range wider than the reflection ranges of the upper and lower reflectors. Such an active layer may be, for example, one having a quantum well structure with which light can be emitted at least at two different energy levels. The quantum well structure may include a single quantum well or a multiple quantum well formed of a plurality of layers.

The material and structure of the active layer according to the present embodiment may be selected as appropriate in accordance with the intended oscillation wavelength.

The active layer according to the present embodiment may be configured to emit light either when the active layer is excited by being irradiated with light or when a current is injected into the active layer. The surface emitting laser according to the present embodiment or an optical coherence tomography apparatus, which will be described below, may include an excitation light source for exciting the active layer or a power supply for injecting a current into the active layer. In the case where light is emitted when a current is injected into the active layer, electrodes are required. However, in this specification and the drawings, the electrodes are omitted to simplify the description.

First Cladding Layer and Second Cladding Layer

In the embodiment of the present embodiment, cladding layers are provided to trap the light and carriers. In addition, in the embodiment of the present invention, the cladding layers serve a function as spacers for adjusting the cavity length.

In the present embodiment, AlGaAs layers in which the Al composition is appropriately selected in accordance with the wavelength range of the emitted light may be used as the first and second cladding layers. For example, in the case where light with a wavelength range around 850 nm is to be emitted, AlGaAs layers in which the Al composition is 30% or more may be used to avoid absorption of light. In the case where light with a wavelength range around 1060 nm is to be emitted, it is not necessary to take light absorption into consideration. Therefore, GaAs layers or AlGaAs layers of any composition may be used. In the structure in which light is emitted when a current is injected into the active layer, the first and second cladding layers may be of different conductivity types. The thicknesses of the first and second cladding layers are not necessarily equal to each other, and may be selected as appropriate in consideration of thicknesses required for current diffusion.

Current Confinement Layer

In the present embodiment, a current confinement layer (not shown) that limits the region in which a current injected into the laser flows can be provided as necessary. The current confinement layer may be formed by, for example, implanting hydrogen ions or selectively oxidizing an AlGaAs layer provided in a cladding layer and having an Al composition of 90% or more. In the present embodiment, the current confinement layer is not necessary in the case where light is emitted when the active layer is excited by being irradiated with light. The current confinement layer is suitable for use in the case where light is emitted when a current is injected into the active layer.

Air Gap

The air gap according to the present embodiment does not generally have a solid material disposed therein. The air gap may be evacuated or filled with fluid, such as air, inert gas, or liquid like water, depending on the atmosphere of the air gap. Here, evacuation means to reduce the air pressure to a negative pressure that is lower than the standard atmospheric pressure. In this specification, calculations are performed on the assumption that the air gap is filled with air and the refractive index is 1.

The length of the air gap (d in FIG. 1) may be determined in consideration of the tunable wavelength range and pull-in of a movable mirror. For example, in a microcavity having a cavity length of 3λ, or 4λ that is structured such that the air gap is filled with air, the center wavelength is 1060 nm, and the tunable wavelength range is 100 nm, the length d of the air gap is about 1 μm.

Driving Unit

In the structure to which the present invention is applied, the upper reflector and the slab may be moved in the vertical direction by using a technology that is commonly used in the field of MEMS. For example, electrostatic, piezoelectric, thermal, or electromagnetic force or fluid pressure may be used.

For example, the driving unit may include a MEMS mechanism activated when a voltage is applied to, or a piezoelectric material. More specifically, an electrostatic force may be applied in the optical axis direction between the upper reflector, or a layer on which the upper reflector is provided, and a multilayer body in which the lower reflector, the active layer, etc., are stacked. The upper reflector may be moved by changing the magnitude of the electrostatic force. This may also be applied to the case in which the driving unit or the lower reflector is moved.

The driving unit may have a cantilever structure or a doubly supported beam structure.

The driving unit according to the present embodiment may be configured to move the upper reflector, the lower reflector, or both the upper and lower reflectors. The driving may also be configured to move the slab. In the present embodiment, a controller for controlling the positions of the upper reflector and the slab may be provided to appropriately control the positional relationship between the upper reflector and the slab.

A plurality of the surface emitting lasers according to the present embodiment may be arranged on the same plane and used as an array light source.

Optical Coherence Tomography Apparatus

Figure 12:
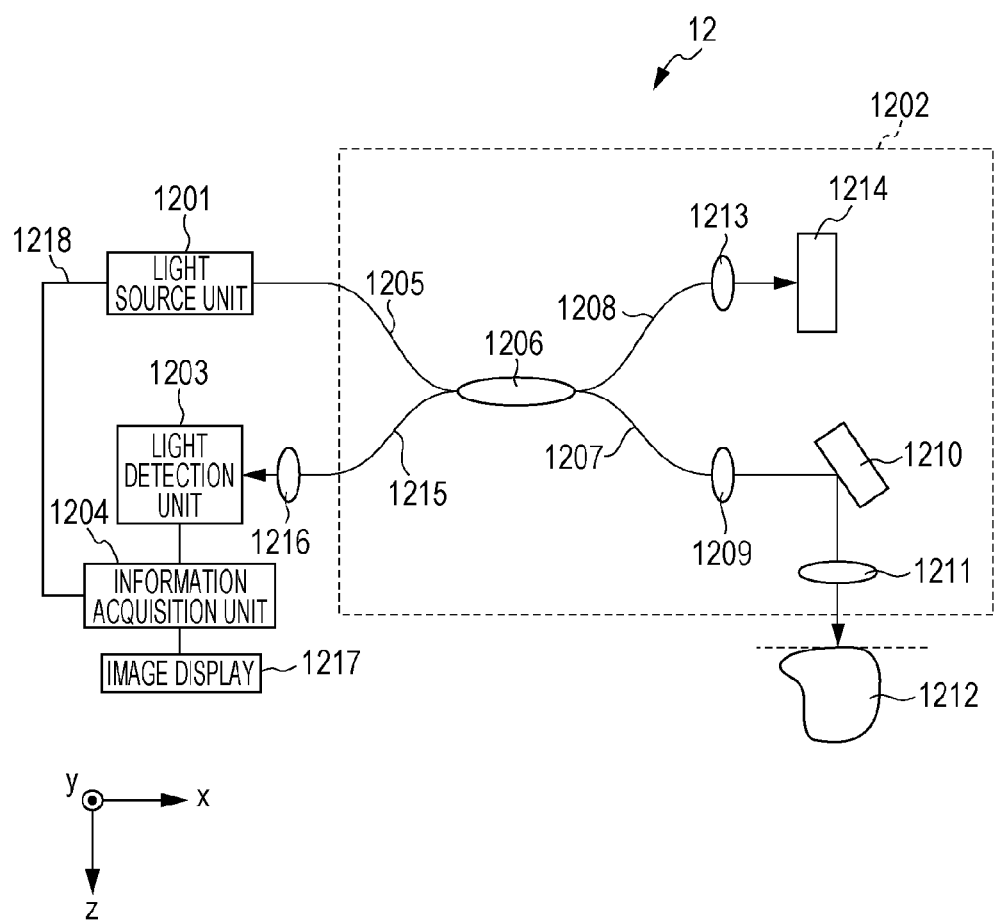
FIG. 12 is a schematic diagram illustrating an optical coherence tomography apparatus according to an embodiment of the present invention.

An optical coherence tomography (OCT) apparatus including a wavelength tunable light source does not include a spectroscope, and is therefore expected to be capable of acquiring tomographic images with high SN ratio and low loss in the amount of light. An example in which the surface emitting laser according to the present embodiment is used as a light source unit of an OCT apparatus will now be described with reference to FIG. 12.

An OCT apparatus 12 according to the present embodiment includes at least a light source unit 1201, an interference optical system 1202, a light detection unit 1203, and an information acquisition unit 1204. The light source unit 1201 may be the above-described surface emitting laser. Although not illustrated, the information acquisition unit 1204 includes a Fourier transformer. The form of the Fourier transformer included in the information acquisition unit 1204 is not particularly limited as long as the information acquisition unit 1204 has a function of taking the Fourier transform of data input thereto. For example, the information acquisition unit 1204 may include a computing unit, and the computing unit may have a function of taking the Fourier transform. More specifically, the computing unit is a computer including a central processing unit (CPU), and the computer executes an application having a Fourier transform function. As another example, the information acquisition unit 1204 may include a Fourier transform circuit having a Fourier transform function. Light emitted from the light source unit 1201 passes through the interference optical system 1202, and is output as interference light having information of a measurement object 1212. The interference light is received by the light detection unit 1203. The light detection unit 1203 may either be a difference detecting type or simple intensity monitor type. Information regarding the temporal waveform of the intensity of the received interference light is transmitted from the light detection unit 1203 to the information acquisition unit 1204. The information acquisition unit 1204 acquires the temporal waveform of the intensity of the received interference light and takes the Fourier transform to acquire information of the object 1212 (for example, information of a tomographic image). Components other than the light source unit 1201, the interference optical system 1202, the light detection unit 1203, and the information acquisition unit 1204 described herein may also be provided optionally.

Next, the operation from the oscillation of light in the light source unit 1201 to acquisition of information of the tomographic image of the measurement object will be described in detail.

Light which has been emitted from the wavelength tunable light source unit 1201 passes through an optical fiber 1205, enters a coupler 1206, where the light is divided into irradiation light which passes through an irradiation light fiber 1207, and reference light which passes through a reference light fiber 1208. The coupler 1206 may be configured to operate in a single mode in the wavelength range of the light source, and 3 dB couplers may be uses as fiber couplers. The irradiation light passes through a collimator 1209 so that the irradiation light is collimated, and is reflected by a mirror 1210. The light reflected by the mirror 1210 passes through a lens 1211, is incident on the object 1212, and is reflected by each layer of the object 1212 in the depth direction of the object 1212. The reference light passes through a collimator 1213 and is reflected by a mirror 1214. The coupler 1206 generates the interference light by causing the reflected light from the object 1212 and the reflected light from the mirror 1214 to interfere with each other. The interference light passes through an optical fiber 1215, is collected through a collimator 1216, and received by the light detection unit 1203. Information regarding the intensity of the interference light received by the light detection unit 1203 is converted into electrical information such as voltage, and is transmitted to the information acquisition unit 1204. The information acquisition unit 1204 processes the data of the intensity of the interference light, more specifically, takes the Fourier transform of the data to acquire information of the tomographic image. The data of the intensity of the interference light subjected to the Fourier transform is normally data sampled at equal wavenumber intervals by using a k clock. However, data sampled at equal wavelength intervals may instead be used.

The acquired information of the tomographic image may be transmitted from the information acquisition unit 1204 to an image display 1217 and displayed as an image. A three-dimensional tomographic image of the measurement object 1212 can be obtained by scanning the mirror 1210 along a plane perpendicular to the direction in which the irradiation light is incident. The information acquisition unit 1204 may control the light source unit 1201 through an electric circuit 1218. Although not illustrated in FIG. 12, the intensity of the light emitted from the light source unit 1201 may be monitored, and the monitored data may be used to correct the amplitude of the signal representing the intensity of the interference light. The surface emitting laser according to the embodiment of the present invention is capable of performing laser beam oscillation over a wide wavelength range while suppressing an increase in a threshold current for emitting the laser beam and a reduction in the light emitting efficiency. Here, the fact that the increase in the threshold current and the reduction in the light emitting efficiency are suppressed does not necessarily mean that they are reduced to zero.

Therefore, when the surface emitting laser according to the present embodiment is included in an OCT apparatus, the current for outputting the laser beam can be reduced, and tomographic images with a high axial resolution can be obtained.

The OCT apparatus according to the embodiment is useful in obtaining a tomographic image of a living body, such as an animal or a human, in the field of ophthalmology, dentistry, dermatology, or the like. Information regarding a tomographic image of a living body includes not only a tomographic image of a living body but also numerical data required to obtain a tomographic image.

In particular, the OCT apparatus may be used to acquire information of a tomographic image of an eye-ground of a human by setting the eye-ground as a measurement object.

Other Usages

The surface emitting laser according to the embodiment of the present invention may be used not only as a light source for an OCT apparatus but also as a light source for optical communication or optical measurement.

EXAMPLES

Examples of the present invention will now be described. The present invention is not limited to the structures of the examples described below. For example, the types, compositions, shapes, and sizes of the materials may be changed as appropriate within the scope of the present invention.

In the examples described below, the laser oscillation wavelength is set to around 1060 nm or around 850 nm. However, the laser oscillation wavelength may be set to any wavelength by selecting an appropriate material and structure.

First Example

Figure 8:
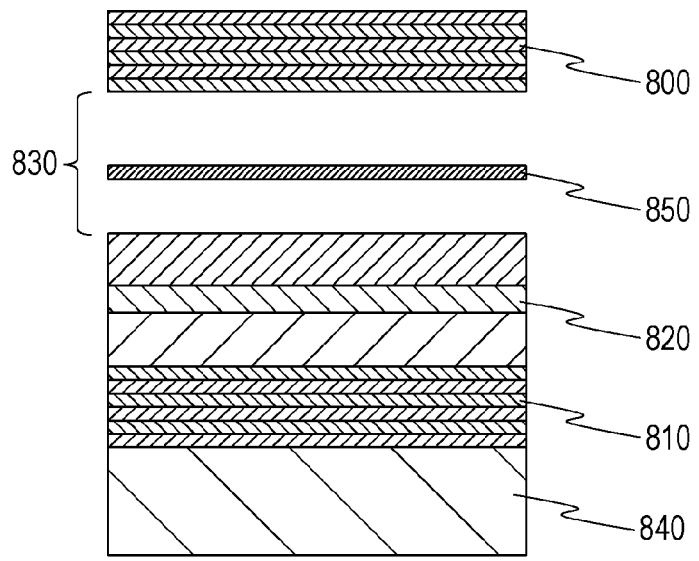
FIG. 8 is a schematic sectional view illustrating the structure of a surface emitting laser according to a first example of the present invention.

A surface emitting laser according to a first example will be described with reference to FIG. 8. FIG. 8 is a schematic sectional view illustrating the layer structure of a VCSEL according to the first example.

In this example, the VCSEL is formed of a compound semiconductor including GaAs as a base material, and is designed such that wavelength sweeping can be performed around a center wavelength of 1060 nm.

An upper reflector 800, an air gap 830, an active layer 820, a lower reflector 810, and a GaAs substrate 840 are arranged in that order from the top. A slab 850 is disposed in the air gap 830.

The upper reflector 800 is a DBR including a stack of 36.5 pairs of layers formed by alternately stacking $Al_{0.4}Ga_{0.6}As$ and $Al_{0.9}Ga_{0.1}As$ layers.

The upper reflector 800 can be moved in the vertical direction by an electrostatic force generated when a voltage is applied. In FIG. 8, electrodes used to apply a voltage are omitted.

The air gap 830 is filled with air, and the length of the air gap (air gap length) is variable around 1650 nm.

The active layer 820 has a multiple quantum well structure in which three cycles of layers, each cycle including a quantum well layer made of GaInAs and a barrier layer made of GaAsP, are stacked together.

The active layer emits light when a current is injected thereinto. In FIG. 8, electrodes used to inject a current are omitted.

The optical thickness of the semiconductor multilayer film that is disposed between the air gap 830 and the lower reflector 810 and includes the active layer corresponds to about 3λ, when the center wavelength 1060 nm is 1λ.

The lower reflector 810 is a DBR in which a stack of 5 pairs of layers formed by alternately stacking $Al_{0.4}Ga_{0.6}As$ and $Al_{0.9}Ga_{0.1}As$ layers is provided on a stack of 30 pairs of layers formed by alternately stacking GaAs and AlAs layers.

The air gap 830 of this example is formed by epitaxial growth and selective wet etching. The procedure of forming the air gap 830 will now be described.

When epitaxial growth is performed, a portion corresponding to the air gap is formed as a sacrificial layer of GaAs.

When a mixed solution of water, citric acid, and a hydrogen peroxide solution is used as an etchant, selective etching can be performed in accordance with the Al composition of AlGaAs. In this example, a mixture of a citric acid solution, obtained by mixing water and citric acid (weight ratio 1:1), and a hydrogen peroxide solution with a concentration of 30% in a ratio of 4:1 is used as an etchant. Selective etching of GaAs and $Al_{0.7}Ga_{0.3}As$ can be performed by using this etchant, and the air gap can be formed by removing only the GaAs sacrificial layer.

According to calculations, in the case where the slab 850 is not provided, the wavelength tuning efficiency in a range around the center wavelength of 1060 nm is about 0.05. In contrast, when the slab 850 is provided, the wavelength tuning efficiency can be increased to 0.24.

Thus, with the structure to which the present invention is applied, a wavelength tuning efficiency higher than that in the related art can be obtained.

Second Example

Figure 13:
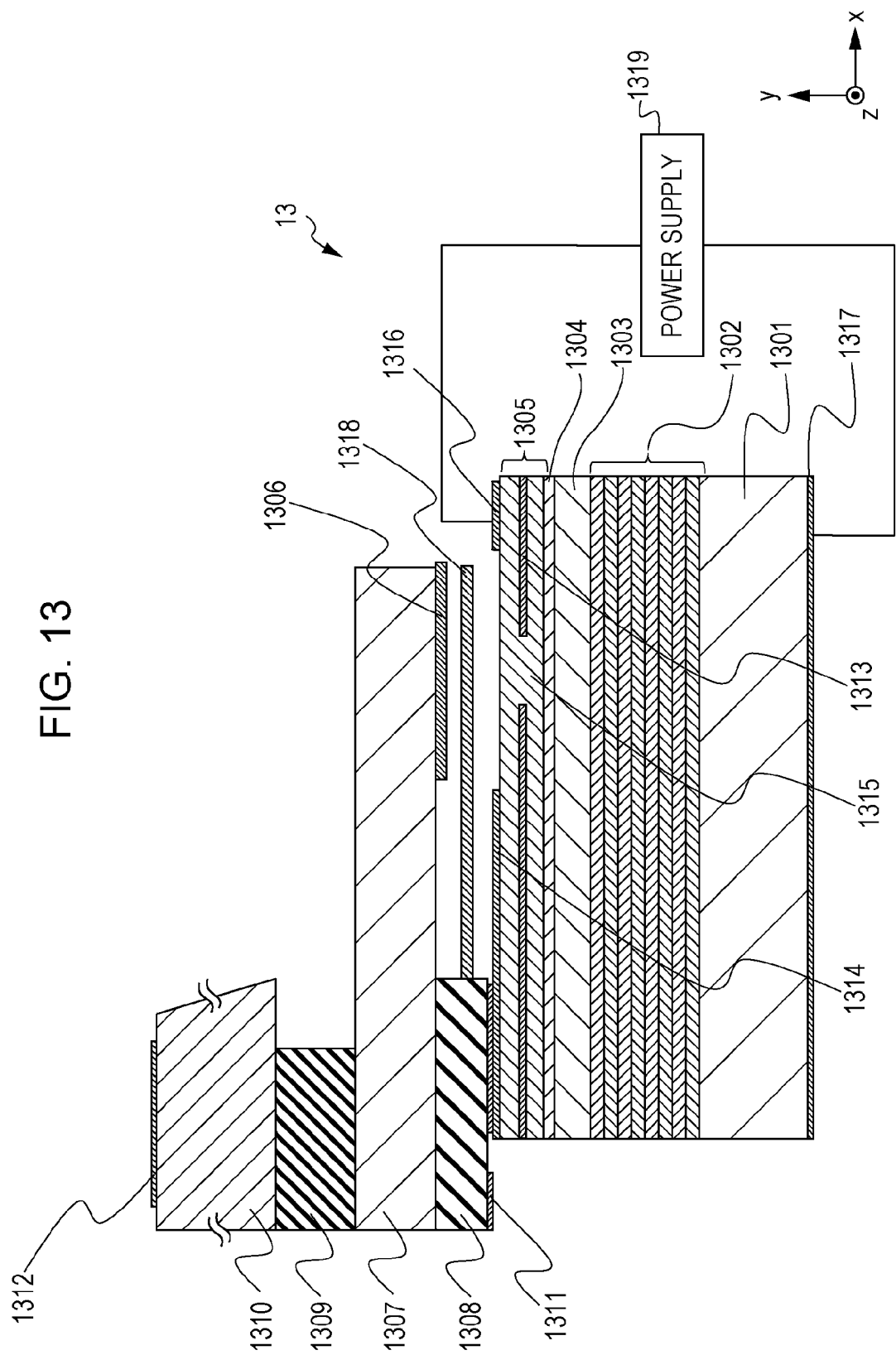
FIG. 13 is a schematic sectional view illustrating the structure of a surface emitting laser according to a second example of the present invention.

FIG. 13 illustrates a schematic diagram illustrating the structure of a surface emitting laser according to a second example. In FIG. 13, an n-type multilayer mirror 1302 is provided on an n-type semiconductor substrate 1301 formed of a GaAs layer, which is a group III-V compound semiconductor. The n-type multilayer mirror (DBR) 1302 has a multilayer body in which 45 pairs of layers are stacked together, each pair including an $Al_{0.8}GaAs$ layer (68.1 nm thick) and an $Al_{0.3}GaAs$ layer (62 nm thick), which are group III-V compound semiconductors.

An n-type cladding layer 1303, which is formed of an $Al_{0.8}GaAs$ layer (102.6 nm thick), is provided on the DBR 1302. An active layer 1304 having a triple quantum well structure, in which GaAs well layers (10 nm thick) and $Al_{0.3}GaAs$ barrier layers (10 nm thick) are combined, is provided on the n-type cladding layer 1303. A p-type cladding layer 1305, which is formed of an $Al_{0.8}GaAs$ layer (337.4 nm thick), is provided on the active layer 1304.

A movable mirror 1306 is provided on the bottom surface of an end portion of a silicon cantilever (2 μm thick) 1307. The silicon cantilever 1307 is supported by a silicon oxide layer 1308 (1 μm thick), the silicon cantilever (2 μm thick) 1307, a silicon oxide film (2.5 μm thick) 1309, and a silicon substrate 1310 at a position above the substrate 1301 with some layers disposed therebetween. The movable mirror 1306 is a dielectric DBR in which 10 pairs of layers, each pair including a $SiO_2$ layer (145.5 nm thick) and a $TiO_2$ layer (90 nm thick), are stacked together. The thickness of the silicon oxide layer 1308 is equal to the thickness of the air gap, and the cavity length is 3λ when the movable mirror is not driven. A Ti/Au electrode 1311 and a Ti/Au electrode 1312 are provided to apply a voltage for driving the silicon cantilever with an electrostatic attraction.

In this example, the movable mirror 1306 is provided on the bottom surface of the end portion of the silicon cantilever 1307. However, the movable mirror 1306 may instead be provided on the top surface of the end portion of the silicon cantilever 1307. Moreover, a part of the end portion of the silicon cantilever 1307 may be removed after the movable mirror 1306 is provided on the top or bottom surface of the end portion of the cantilever 1307.

The cladding layer 1305 includes a current confinement layer 1313 formed by implanting proton ions into a portion of the p-type cladding layer 1305. Therefore, a current supplied from an electrode 1316 flows into the active layer 1304 through an opening 1315 in the current confinement layer 1313. With regard to electrodes for activating the wavelength tunable VCSEL of this example, a metal multilayer film formed of a Ti layer (20 nm) and a Au layer (100 nm) is used as an electrode 1316, and a metal multilayer film formed of a mixed crystal of Au and Ge (100 nm), Ni (20 nm), and Au (100 nm) is used as an electrode 1317. The VCSEL is driven by a power supply 1319.

Metal multilayer films formed of a Ti layer (20 nm) and a Au layer (100 nm) are used as the electrodes 1314 and 1312.

In this example, a silicon MEMS structure formed by processing a silicon-on-insulator (SOI) substrate is used as a driving unit on which the emission-side mirror (upper mirror) 1306 is formed. The wavelength tunable VCSEL is formed by bonding the driving unit to the compound semiconductor substrate 1301 on which the lower multilayer mirror (DBR) 1302, the lower cladding layer 1303, the active layer 1304, the upper cladding layer 1305, etc., are formed.

In this example, the light emitting region defined by the proton-implanted region, that is, the opening 1315 in the current confinement structure formed by proton ion implantation, has a circular shape with a diameter of 5 μm.

In this example, a slab 1318 is provided. By moving the upper reflector 1306 in the above-described manner, mode hopping can be suppressed and the wavelength tunable range can be increased. The structure may instead be such that the slab 1318 and the lower reflector 1302 are moved.

A method for manufacturing the wavelength tunable VCSEL of this example will now be described.

First, the n-type DBR 1302, the n-type cladding layer 1303, the active layer 1304, and the p-type cladding layer 1305 are successively formed by the MOCVD crystal growth method on the n-type semiconductor substrate 1301 formed of a GaAs layer.

Next, a silicon oxide film is formed on the p-type cladding layer 1305, and is processed by photolithography and etching so that the film functions as a mask during ion implantation for forming the current confinement structure. After the silicon oxide film that functions as the mask (not shown) is formed, ion implantation is performed to form the current confinement structure. To form the current confinement structure, an AlGaAs layer (30 nm thick) having an Al composition of 90% or more may be formed in the cladding layer 1305, and a high-resistance region may be formed by selectively oxidizing a portion of the layer in an x-axis direction from a side surface thereof and converting that portion into aluminum oxide.

Next, the electrode 1316 is formed by photolithography, vacuum deposition, and liftoff.

Next, the cathode electrode 1317 for driving the VCSEL is formed on the back side of the semiconductor substrate 1301 by vacuum deposition. Thus, a compound semiconductor light-emitting device is completed.

In this example, the conductivity types of the semiconductor layers may be reversed. In other words, the p-type semiconductor layers may be changed to n-type semiconductor layers, and the n-type semiconductor layers may be changed to p-type semiconductor layers. The dopant of the p-type semiconductor layers may be Zn, and the dopant of the n-type semiconductor layers may be C. However, the dopants are not limited to this.

In the wavelength tunable VCSEL of this example, it is assumed that wavelength sweeping is performed in a wavelength range of ±50 nm with a wavelength of 850 nm at the center. However, the wavelength range is not limited to this, and wavelength sweeping may instead be performed in a wavelength range of, for example, ±50 nm with a wavelength of 1060 nm at the center by selecting appropriate materials for the layers included in the VCSEL.

The present invention provides a wavelength tunable surface emitting laser with which the wavelength tuning efficiency can be increased by appropriately arranging a slab in an air gap, the slab having a refractive index that differs from that of the air gap.

Third Example

Figure 14:
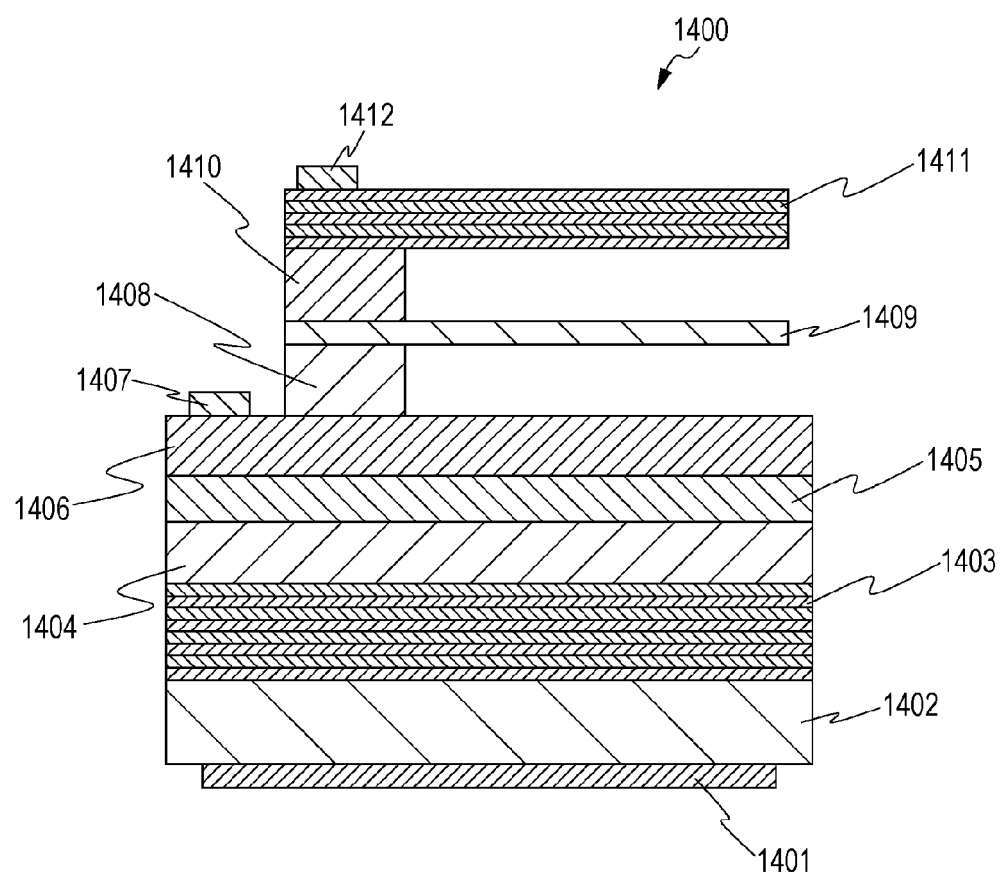
FIG. 14 is a schematic sectional view illustrating the structure of a surface emitting laser according to a third example of the present invention.

A surface emitting laser according to a third example will be described with reference to FIG. 14. FIG. 14 is a schematic sectional view illustrating the layer structure of a VCSEL according to the third example.

A VCSEL 1400 according to this example includes a cathode electrode 1401 for driving the VCSEL, an n-type substrate 1402 made of GaAs, an n-type lower DBR 1403 that is a stack of 40.5 pairs of layers formed by alternately stacking AlAs and GaAs layers, an n-type lower spacer layer 1404 made of $Al_{0.7}Ga_{0.3}As$, an undoped active layer 1405 formed of a multiple quantum well layer including a quantum well layer made of InGaA and a GaAsP barrier layer, and a p-type upper spacer layer 1406 made of $Al_{0.7}Ga_{0.3}As$, which are arranged in that order. An electrode 1407 for driving the VCSEL and an upper DBR is formed on the upper spacer layer 1406. An undoped GaAs layer 1408, an undoped slab 1409 made of $Al_{0.7}Ga_{0.3}As$, an undoped GaAs layer 1410, an n-type upper DBR 1411, and an electrode 1412 for driving the upper DBR are also provided on the upper spacer layer 1406. The n-type upper DBR 1411 includes a stack of 30 pairs of layers formed by alternately stacking $Al_{0.9}Ga_{0.1}As$ and $Al_{0.4}Ga_{0.6}As$ layers and $Al_{0.7}Ga_{0.3}As$ layers provided as the uppermost and lowermost layers that sandwich the stack of layers.

Similar to the first and second examples, the structure of this example is produced by common semiconductor processes, such as epitaxial growth, photolithography, dry etching, wet etching, and vacuum deposition.

A semiconductor multilayer film is formed on the substrate 1402 to a height corresponding to that of the upper DBR 1411 by epitaxial growth.

Next, the pattern of a beam structure including the slab 1409 and the upper DBR 1411 is formed by photolithography and dry etching. The depth to which dry etching is performed is set to the depth at which the GaAs sacrificial layer 1408 is exposed.

Next, the beam structure is formed by removing portions of the GaAs sacrificial layer 1408 and the GaAs sacrificial layer 1410 by wet etching using a mixture of a solution of citric acid and a hydrogen peroxide solution. In this process, the sacrificial layers may be covered with photoresist or the like in a certain region so that they remain unetched in that region.

Next, the electrodes 1407 and 1412 are formed by photolithography, vacuum deposition, and liftoff.

Next, the cathode electrode 1401 for driving the VCSEL is formed on the back side of the semiconductor substrate 1402 by vacuum deposition. Thus, a compound semiconductor light-emitting device is completed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-135390 filed Jun. 30, 2014, which is hereby incorporated by reference herein in its entirety.

What is claimed is:

1. A surface emitting laser comprising:
a lower reflector, an active layer, and an upper reflector that are arranged in that order;

an air gap provided between the active layer and the upper reflector; and a slab provided on an optical path of the air gap and having a refractive index that differs from a refractive index of the air gap, wherein at least one of the upper reflector and the lower reflector is configured so as to be movable in an optical axis direction so that a wavelength of emitted light changes in accordance with a change in a position of the at least one of the upper reflector and the lower reflector in the optical axis direction, wherein, in the case where the position of the upper reflector is changed, a center of the slab in the optical axis direction is located between any antinode of a standing wave formed in the air gap and a node of the standing wave on an upper-reflector side of the antinode, wherein, in the case where the position of the lower reflector is changed, the center of the slab in the optical axis direction is located between any antinode of the standing wave formed in the air gap and a node of the standing wave on a lower-reflector side of the antinode, and wherein an optical thickness of the slab in the optical axis direction is in a range of greater than 0 and smaller than ½ a center wavelength of the surface emitting laser, or is the sum of an optical thickness in the range and half an integral multiple of the center wavelength.

2. The surface emitting laser according to claim 1, wherein an optical thickness of a microcavity, which is formed between the upper reflector and the lower reflector, in the optical axis direction is smaller than or equal to 10 times a center wavelength of the surface emitting laser.

3. The surface emitting laser according to claim 1, wherein an optical thickness of a microcavity, which is formed between the upper reflector and the lower reflector, in the optical axis direction is smaller than or equal to 3 times a center wavelength of the surface emitting laser.

4. The surface emitting laser according to claim 1, wherein an optical thickness of the slab in the optical axis direction is in a range of greater than ⅛ a center wavelength of the surface emitting laser and smaller than ⅜ the center wavelength, or is the sum of an optical thickness in the range and half an integral multiple of the center wavelength.

5. The surface emitting laser according to claim 1, wherein a thickness of the slab in the optical axis direction is 40 nm or more and 100 nm or less.

6. The surface emitting laser according to claim 1, wherein a thickness of the slab in the optical axis direction is 60 nm or more and 80 nm or less.

7. The surface emitting laser according to claim 1, wherein the slab is movable.

8. A surface emitting laser comprising:

a lower reflector, an active layer, and an upper reflector that are arranged in that order;

an air gap provided between the active layer and the upper reflector; and a slab provided on an optical path of the air gap and having a refractive index that is higher than a refractive index of the air gap, wherein a position of at least one of the upper reflector and the lower reflector in an optical axis direction is changed to change a wavelength of emitted light, and wherein the slab is provided at a position where, in a standing wave formed in the air gap, a light intensity at a center of the slab is higher when a length of the air gap in the optical axis direction is A than when the length of the air gap in the optical axis direction is B, which is smaller than A.

9. An optical coherence tomography apparatus comprising:

a light source unit that changes a wavelength of light;

an interference optical system that divides the light from the light source into irradiation light with which an object is to be irradiated and reference light and generates interference light by causing reflected light of the irradiation light with which the object has been irradiated and the reference light to interfere with each other;

a light detection unit that receives the interference light; and an information acquisition unit that acquires information of the object by processing a signal from the light detection unit, wherein the light source unit is the surface emitting laser according to claim 1.

10. The surface emitting laser according to claim 1, wherein the slab is provided in the air gap.

11. The surface emitting laser according to claim 1, wherein the surface emitting laser is configured to emit light by injecting a current into the active layer.

* * * * *